United States Patent [19]

Melton et al.

[11] Patent Number: 5,221,038
[45] Date of Patent: Jun. 22, 1993

[54] METHOD FOR FORMING TIN-INDIUM OR TIN-BISMUTH SOLDER CONNECTION HAVING INCREASED MELTING TEMPERATURE

[75] Inventors: Cynthia M. Melton, Bolingbrook; Andrew Skipor, Glendale Heights, both of Ill.

[73] Assignee: Motorola, Inc., Schaumburg, Ill.

[21] Appl. No.: 956,236

[22] Filed: Oct. 5, 1992

[51] Int. Cl.⁵ ............... B23K 20/233; B23K 101/36; H05K 3/34
[52] U.S. Cl. .................. 228/180.2; 228/197
[58] Field of Search ............ 228/180.2, 248, 225, 228/254, 195, 198, 56.3, 197

[56] References Cited

U.S. PATENT DOCUMENTS

| | | | |
|---|---|---|---|
| 3,292,240 | 12/1966 | McNutt et al. | 228/180.2 X |
| 3,839,727 | 10/1974 | Herdzik et al. | 29/578 X |
| 4,746,055 | 5/1988 | Ingram et al. | 228/195 |
| 4,831,724 | 5/1989 | Elliott | 228/180.2 |
| 4,950,623 | 8/1990 | Dishon | 228/180.2 |
| 5,038,996 | 8/1991 | Wilcox et al. | 228/195 X |
| 5,060,844 | 10/1991 | Behun et al. | 228/180.2 |
| 5,062,896 | 11/1991 | Huang et al. | 148/24 X |

OTHER PUBLICATIONS

American Society for Metals, *Welding, Brazing, and Soldering, Metals Handbook*, Ninth Edition, vol. 6 (1983) pp. 1069–1076.
*Metal Finishing*, (1986) pp. 298–303.
"Reflow Solder Joint With Extended Height", IBM Technical Disclosure Bulletin, vol. 28, No. 7, Dec. 1985, p. 2871.
"Tin Plating During Immersion Soldering", IBM Technical Disclosure Bulletin, vol. 19, No. 3, Aug. 1976, p. 833.
"Low Temperature C4 Chip Joining Technique", Research Disclosure, Kenneth Mason Publications Ltd., England, Oct. 1990, No. 31832.

*Primary Examiner*—Mark Rosenbaum
*Assistant Examiner*—Jeanne M. Elpel
*Attorney, Agent, or Firm*—Douglas D. Fekete; Donald B. Southard

[57] ABSTRACT

A solder connection (30) is formed based upon a tin-indium or tin-bismuth alloy, but having a melting temperature greater than the melting temperature of the initial solder alloy. A deposit (26) of solder alloy is placed against a tin plate (24) applied, preferably by electrodeposition, to a first faying surface (18). Following assembling with a second faying surface (22), the assembly is heated to melt the solder deposit, whereupon tin from the tin plate dissolves into the solder liquid to form a tin-enriched alloy having an increased melting temperature.

17 Claims, 1 Drawing Sheet

METHOD FOR FORMING TIN-INDIUM OR TIN-BISMUTH SOLDER CONNECTION HAVING INCREASED MELTING TEMPERATURE

BACKGROUND OF THE INVENTION

This invention relates to a solder connection composed of a lead-free tin-base alloy containing indium or bismuth. More particularly, this invention relates to a method for forming such solder connection having a liquids temperature that is increased relative to the initial solder alloy.

One method for forming a solder connection, for example, for physically and electrically connecting components of a microelectronic package, utilizes a solder paste. A typical paste is composed of a power formed of a solder alloy and dispersed in a liquid vehicle. One advantage of the paste is that it may be conveniently applied to a faying surface, for example, by screen printing. Following application, the paste is dried and heated to reflow the solder alloy to form a liquid phase that wets the faying surfaces. Wetting provides intimate contact between the molten alloy and the solid faying surface and is essential in obtaining a strong bond. A flux may be added to promote wetting by removing oxides or other contaminants from the faying surfaces during the early stages of heating. Nevertheless, reflow of the solder must necessarily extend for a sufficient time not only to melt the alloy, but also to permit fluxing and wetting to be completed.

In the past, most common solders were based upon tin-lead alloy. Tin and lead form a eutectic composition having a melting temperature of about 183° C., which is suitably low to permit reflow while avoiding thermal damage to the components, but is sufficiently high to withstand temperature excursions of the type experienced by the package during normal operations. As used herein, melting temperature refers to the liquidus temperature, that is, the temperature above which the alloy exists as a uniform liquid phase, as opposed to the solidus temperature below which the alloy exists as a solid phase. It is desired to eliminate lead from solder connections. To this end, it has been proposed to utilize tin alloys containing bismuth or indium. Tin and bismuth form a eutectic composition containing about 60 weight percent bismuth and having a melting temperature of about 138.5° C. Similarly, tin and indium form a eutectic composition containing about 50.9 weight percent tin and having a melting point of about 120° C. Such low temperatures are not deemed adequate to withstand the thermal cycling experienced during typical usage. Thus, there is a need for a method for forming a solder connection that is based upon tin-indium alloy or tin-bismuth alloy and that has an increased melting temperature suitable for electronic applications.

SUMMARY OF THE INVENTION

This invention contemplates a method for forming a solder connection based upon a tin-indiuim or tin-bismuth alloy and having an increased melting temperature suitable to improve the integrity of the connection during temperature excursions of the type typically experienced by electronic packages. The method comprises applying a tin plate to at least one faying surface to alloy with the liquid solder during reflow to form a tin-enriched alloy having the desired increased melting temperature.

In accordance with this invention, a deposit of solder alloy is applied to or otherwise heated in contact with the tin plate. A preferred solder deposit is applied as a paste and is composed of particles of solder alloy having a near-eutectic composition. A second faying surface is then assembled in contact with the solder deposit. The assembly is heated to a temperature greater than the melting point of the solder deposit, whereupon the solder alloy reflows to form a liquid phase. As the temperature is increased above the melting point of the solder deposit, tin from the tin plate dissolves into the liquid phase to form a tin-enriched alloy having a melting temperature greater than the melting temperature of the initial alloy. It is a feature of the preferred embodiment that excess tin is available for dissolution to permit the melting temperature to be raised to the maximum temperature of the reflow cycle, preferably greater than 180° C. Thus, the resulting solder connection is composed of tin-enriched alloy containing indium or bismuth and having a melting temperature suitable for use in electronic packages.

DESCRIPTION OF THE DRAWINGS

The present invention will be further illustrated with reference to the accompanying drawings wherein.

DETAILED DESCRIPTION OF THE INVENTION

Figure 1:
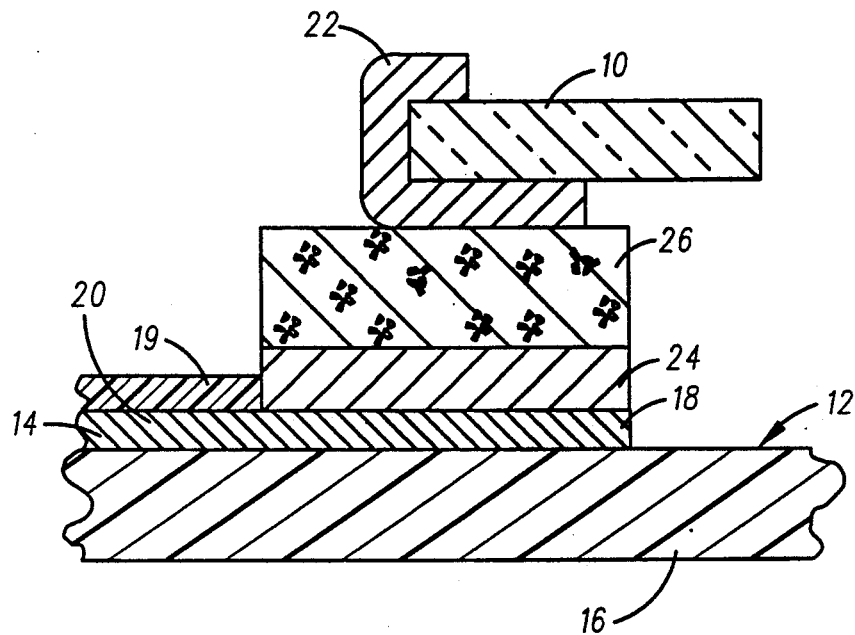
FIG. 1 is a cross sectional view of an assembly for forming a solder connection in accordance with this invention.
Figure 2:
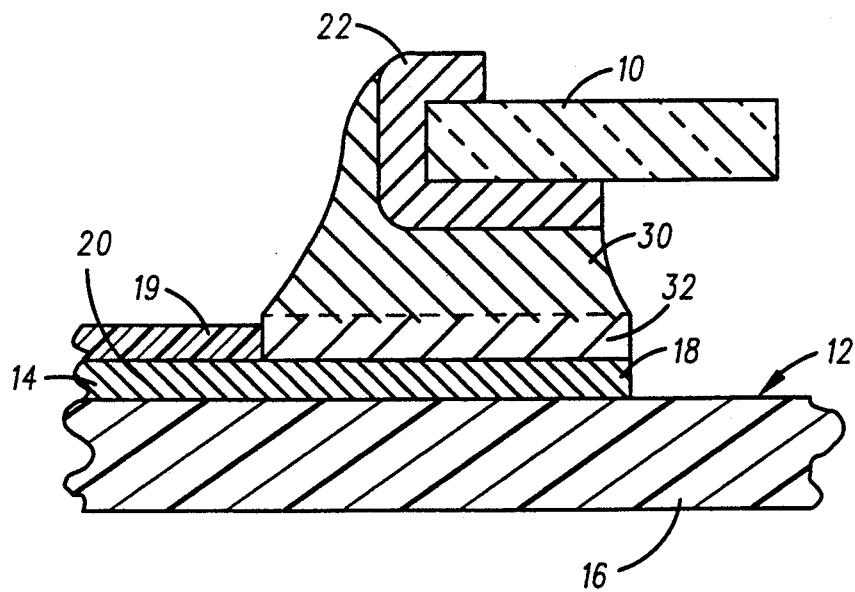
FIG. 2 is a cross sectional view of the solder connection formed from the assembly in FIG. 1.

In a preferred embodiment, referring to FIGS. 1-2, the method of this invention is employed to attach a discrete component 10, such as a resistor or the like, to a printed circuit board 12. Printed circuit board 12 comprises a metallic copper trace 14 affixed to the dielectric substrate 16 of the type referred to as an FR4 card and composed of an epoxy resin and glass fiber laminate. Trace 14 includes a surface mount pad 18 that is adapted for attaching component 10 and an adjacent runner section 20 for electrically connecting pad 18 to remote sections of trace 14. In this description, pad 18 constitutes a first faying surface for forming the connection. Component 10 comprises a land 22 formed of palladium-silver alloy, which constitutes a second faying surface for the connection. Land 22 may include a thin tin flash to enhance wetting during solder reflow.

In accordance with this invention, a tin plate 24 is initially applied to pad 18. A solder-nonwettable polymeric layer 19, referred to as a solder stop is applied to runner section 20 and developed to expose the copper at pad 18. Polymeric layer 19 is about 25 microns thick and electrically insulates the underlying copper to prevent plating. Tin is electrodeposited onto the exposed copper using a conventional tin-plating solution containing stannous sulfate in an aqueous sulfuric acid solution. The masked board is immersed in the solution at ambient temperature spaced apart from a metallic tin counterelectrode. An electrical potential is applied to the copper plate to negatively bias the copper relative to the counterelectrode and thereby deposit metallic tin. The resulting plate is composed substantially of tin and has a thickness of at least about 40 microns, and preferably between about 50 and 100 microns.

In preparation for forming a connection, a deposit 26 of solder particles is applied to tin plate 24 at pad 18. A preferred solder powder consists of a substantially eutectic composition of about 60 weight percent bismuth and the balance tin. The tin-bismuth powder is dispersed in a solvent composed of high boiling alcohols and glycol and containing a flux comprising white rosin compound. The powder is sized to between −200 and +325 mesh. The paste also includes an expendable organic binder, suitably ethyl cellulose compound. The paste is applied conveniently by screen printing and dried to produce deposit 26, in which the tin-bismuth particles are bonded by the organic binder. In this embodiment, sufficient paste is applied to form a particulate deposit having a thickness of at least 80 microns, and preferably between about 100 and 150 microns.

Following application of deposit 26, components 10 is assembled with faying surface 22 in contact with deposit 26, as depicted in FIG. 1. To complete the connection, the assembly is heated to a temperature greater than 180° C., and preferably greater than 200° C., to reflow the solder alloy. During the initial stages of heating, the organic binder is decomposed and vaporized. As the assembly is heated to about 138.5° C., the solder particles melt and coalesce to produce a liquid phase that wets the adjacent surfaces. Liquification of the particulate layer is accompanied by shrinkage of the apparent volume of the solder and slight collapse of the component toward the pad. As the temperature is increased significantly above 138.5° C., tin from the adjacent solder plate dissolves into the liquid phase to form a tin-enriched alloy. At the maximum temperature, the liquid alloy is composed of between 70 to 80 weight percent tin. The assembly is then cooled to produce a solidified connection 30 in FIG. 2. It is a feature of the preferred embodiment that plate 24 includes tin in excess of the amount required for dissolution, so that a layer 32 of electroplated tin immediately coating pad 18 survives reflow. Thus, connection 30 is bonded to land 22 of component 10 and to the layer 32 plated upon terminal 18.

In an alternate embodiment, solder particles composed of tin-indium alloy are substituted for the tin-bismuth particles in the described example. The solder particles are formed of an alloy containing about 50.9 weight percent indium and the balance tin, corresponding to a eutectic composition having a melting temperature of about 120° C. During heating, the solder particles initially melted to form a liquid phase at the eutectic melting temperature. At higher temperatures, tin from the adjacent plate dissolved into the liquid phase to form a tin-enriched alloy and thereby increase the liquidus temperature of the resulting connection.

Therefore, this invention provides a method for forming a solder connection of a tin-indium or tin-bismuth alloy, but having a melting temperature greater than the initial solder alloy. Preferably, the initial solder deposit is a near-eutectic alloy. For bismuth alloy, a preferred alloy comprises between about 55 and 65 weight percent bismuth and the balance tin. For indium alloy, a preferred composition comprises between about 45 and 55 weight percent indium. In either event, at least one faying surface is initially plated with metallic tin that dissolves during solder reflow. During heating to reflow the solder, the solder deposit commences to melt at the eutectic melting point and is completely molten within a short time thereafter. Formation of this uniform liquid during the early stages of the heating cycle accelerates wetting of the surfaces in contact therewith, including the faying surface and also the tin plate. Wetting of the tine plate facilitates dissolution of the tin as temperature is increased to produce a uniform liquid composition. It is pointed out that the maximum temperature during reflow preferably does not exceed about 232° C., corresponding to the melting temperature of metallic tin, to avoid melting the electroplated tin during reflow. In the described embodiment wherein excess tin is electroplated, solder bonds to the residual tin plate to complete the connection. Alternately, the solder may bond to the underlying copper in the event the temperature and proportions of the plate to the initial solder deposit are sufficient to entirely consume the tin plate. In general, it is desired to deposit sufficient tin in proportion to the solder deposit to increase the the melting temperature of the resulting solder connection to more than 70 weight percent tin and preferably about 70 to 80 weight percent tin, corresponding to a melting temperature of at least 180° C. and more preferably 200° C. Thereafter, when the joint is subjected to temperature excursions of the type normally encountered by electronic packages, the tin-enriched solder remains suitably solid, despite minor eutectic phase melting, to permit the overall connection to maintain its integrity.

In addition to form a connection for mounting a discrete component to a printed circuit board as in the described embodiment, this invention may be utilized to form lead-free joints in other applications. Although in the described embodiment, the faying surfaces were formed of solder-wettable material, such as copper, the faying surface onto which the tin is plated may be suitably formed of any metal that bonds to the plated tin, particularly where a layer of plated tin survives the solder reflow as in the preferred embodiment.

While this invention has been described in terms of certain examples thereof, it is not intended that it be limited to the above description, but rather only to the extent set forth in the claims that follows.

The embodiments of the invention in which an exclusive property or privilege is claimed are defined as follows:

1. A soldering method for bonding a first and a second faying surface using a tin-base solder alloy, said method comprising
    applying a tin plate to the first faying surface,
    placing a solder deposit in contact with the tin plate, said solder deposit being formed of a tin alloy containing a metal selected from the group consisting of indium and bismuth and having a first melting temperature,
    assembling the first and second faying surfaces with the tin plate and solder deposit therebetween to form an assembly,
    heating the assembly to a temperature greater than the first temperature to melt the solder deposit to form a liquid phase in contact with the tin plate, whereupon tin from the tin plate dissolves into the liquid phase to form a tin-enriched alloy having a second melting temperature greater than the first melting temperature, and
    cooling the assembly to solidify the tin-enriched alloy to form a solder connection and thereby bond the faying surfaces.

2. A soldering method in accordance with claim 1 wherein the solder deposit is formed of particles of said tin alloy.

3. A soldering method in accordance with claim 1 wherein the tin alloy comprises between about 55 and 65 weight percent bismuth and the balance substantially tin.

4. A soldering method in accordance with claim 1 wherein the tin alloy comprises between about 45 and 55 weight percent indium and the balance substantially tin.

5. A soldering method in accordance with claim 1 wherein the tin-enriched alloy comprises at least about 70 weight percent tin.

6. A soldering method in accordance with claim 1 wherein the liquidus temperature of the tin-enriched alloy is at least about 180° C.

7. A soldering method in accordance with claim 1 wherein the tin plate is at least about 40 microns thick.

8. A soldering method for bonding a first and a second solder-wettable faying surface using a tin-base solder alloy, said method comprising electrodepositing a tin plate to the first faying surface, said tin plate having a thickness of at least 40 microns, applying a solder paste to the tin plate, said solder paste comprising solder particles dispersed in a vaporizable vehicle and containing an expendable organic binder, said solder particles being composed of a near-eutectic tin alloy containing a metal selected from the group consisting of indium and bismuth and having a first melting temperature, drying the applied paste to from a solder deposit composed of said solder particles bonded by said expendable organic binder, assembling the second faying surface and the first faying surface to forming an assembly such that the second faying surface is in contact with the solder deposit, heating the assembly to a temperature greater than the first melting temperature to vaporize the expendable polymeric binder and to melt the solder deposit to form a liquid phase in contact with the tin plate, whereupon tin from the tin plate dissolves into the liquid phase to form a tin-enriched alloy having a second melting temperature greater than the first melting temperature, and cooling the assembly to solidify the tin-enriched alloy to form a solder joint.

9. A soldering method in accordance with claim 8 wherein the tin plate is between about 50 and 100 microns thick.

10. A soldering method in accordance with claim 8 wherein the solder deposit is at least 80 microns thick.

11. A soldering method in accordance with claim 8 wherein a layer of electrodeposited tin is not dissolved during heating and, following cooling, is bonded to the first faying surface and to the tin-enriched alloy.

12. A soldering method in accordance with claim 8 wherein the assembly is heated to a temperature greater than 180° C.

13. A soldering method in accordance with claims 8 wherein the assembly is heated to a temperature of at least 200° C.

14. A soldering method in accordance with claims 8 wherein the tin-enriched alloy comprises at least 70 weight percent tin.

15. A soldering method for bonding a first and second faying surface using a tin-base solder alloy, said method comprising electrodepositing a tin plate to the first faying surface, applying a solder paste to the tin plate, said solder paste comprising solder particles dispersed in vaporizable vehicle and containing an expendable organic binder, said particles being composed of a near-eutectic solder alloy selected from the group consisting of tin alloy containing between about 55 and 65 weight percent bismuth and tin alloy containing between about 45 and 55 weight percent indium.

drying the applied paste to form a solder deposit having a thickness of at least 80 microns and composed of said solder particles bonded by said expendable organic binder, assembling the second faying surface and the first faying surface to form an assembly such that the second faying surface is in contact with solder deposit, heating the assembly to a temperature greater than 180° C. to vaporize the expendable organic binder and to reflow the solder deposit to form a liquid phase in contact with the tin plate, whereupon tim from the tin plate dissolves into the liquid phase to form a tin-enriched alloy containing at least 70 weight percent tin and having a liquidus temperature greater than the first melting temperature, and cooling the assembly to solidify the tin-enriched alloy to form a solder joint.

16. A soldering method in accordance with claim 15 wherein a layer of electrodeposited tin remains adjacent the first faying surface following heating and is bonded to the tin-enriched alloy.

17. A soldering method in accordance with claim 15 wherein the assembly is heated to a temperature greater than about 200° C. to form a tin-enriched alloy containing between about 70 and 80 weight percent tin.

* * * * *